US009554476B2

(12) United States Patent
Cassin et al.

(10) Patent No.: US 9,554,476 B2
(45) Date of Patent: Jan. 24, 2017

(54) COMPLIANT STAPLE PIN FOR CONNECTING MULTIPLE PRINTED CIRCUIT BOARDS

(71) Applicant: Continental Automotive Systems, Inc., Auburn Hills, MI (US)

(72) Inventors: Jake P Cassin, Streamwood, IL (US); Thomas Brey, Lake in the Hills, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 14/459,481

(22) Filed: Aug. 14, 2014

(65) Prior Publication Data

US 2016/0049741 A1     Feb. 18, 2016

(51) Int. Cl.
| | |
|---|---|
| H01R 12/00 | (2006.01) |
| H05K 3/36 | (2006.01) |
| H01R 12/52 | (2011.01) |
| H01R 12/58 | (2011.01) |
| H01R 12/73 | (2011.01) |
| H05K 1/14 | (2006.01) |

(52) U.S. Cl.
CPC .............. *H05K 3/36* (2013.01); *H01R 9/096* (2013.01); *H01R 12/52* (2013.01); *H01R 12/585* (2013.01); *H05K 3/368* (2013.01); *H01R 12/732* (2013.01); *H05K 1/142* (2013.01); *H05K 2201/10363* (2013.01)

(58) Field of Classification Search
CPC ....... H01R 9/096; H01R 12/585; H01R 31/02; H01R 9/091; H01R 12/52; H01R 12/62; H01R 12/707; H01R 12/718; H01R 43/0256; H01R 31/08; Y10S 439/943

USPC .... 439/507, 509–512, 65, 69, 74, 78, 83, 84
See application file for complete search history.

(56) References Cited

U.S. PATENT DOCUMENTS

| | | | | | |
|---|---|---|---|---|---|
| 3,333,225 | A | * | 7/1967 | McNutt .................. | H01R 29/00 439/692 |
| 4,120,041 | A | * | 10/1978 | Hayakawa ............. | H05K 1/145 361/679.21 |
| 5,257,941 | A | * | 11/1993 | Lwee .................. | H01R 13/5216 439/283 |
| 5,548,486 | A | * | 8/1996 | Kman et al. .................. | 361/791 |
| 5,772,452 | A | * | 6/1998 | Aoyama ................ | H01R 12/73 439/74 |

(Continued)

FOREIGN PATENT DOCUMENTS

| | | |
|---|---|---|
| EP | 0929123 A1 | 7/1999 |
| FR | 2630616 A | 10/1989 |

(Continued)

OTHER PUBLICATIONS

Search Report dated Jan. 9, 2015, from corresponding GB Patent Application No. GB1416377.8.

*Primary Examiner* — Tulsidas C Patel
*Assistant Examiner* — Travis Chambers

(57) ABSTRACT

Circuit boards are mechanically connected to each other by a U-shaped pin, the legs of which are forcibly inserted into holes along edges of the circuit boards. The holes are conventional through-holes having metal linings that are electrically connected to circuit board traces that extend to components on the circuit boards. The U-shaped pin thus electrically connects components on the two circuit boards to each other.

18 Claims, 6 Drawing Sheets

(56) References Cited

U.S. PATENT DOCUMENTS

| | | | | |
|---|---|---|---|---|
| 5,915,999 | A * | 6/1999 | Takenaka | H01R 12/585 439/751 |
| 6,188,583 | B1 * | 2/2001 | Fendt | H05K 1/142 361/752 |
| 6,299,469 | B1 * | 10/2001 | Glovatsky | F02D 9/02 439/329 |
| 7,008,236 | B2 * | 3/2006 | Wabiszczewicz | H05K 1/141 29/402.08 |
| 7,618,283 | B1 * | 11/2009 | Costello | H01R 12/585 439/511 |
| 7,963,796 | B2 * | 6/2011 | Sypolt | H01R 12/58 439/511 |
| 8,467,194 | B2 * | 6/2013 | Sasaki | H01R 12/52 361/792 |
| 8,894,437 | B2 * | 11/2014 | Adams | F21V 21/005 439/509 |
| 2004/0253851 | A1 | 12/2004 | Naitou et al. | |
| 2010/0022137 | A1 * | 1/2010 | Mcalonis | H01R 12/585 439/638 |
| 2011/0011627 | A1 * | 1/2011 | Aspas Puertolas | H05K 1/142 174/251 |

FOREIGN PATENT DOCUMENTS

| | | | | |
|---|---|---|---|---|
| FR | 2630616 A1 * | 10/1989 | | H01R 31/08 |
| JP | H07153509 A | 6/1995 | | |

* cited by examiner

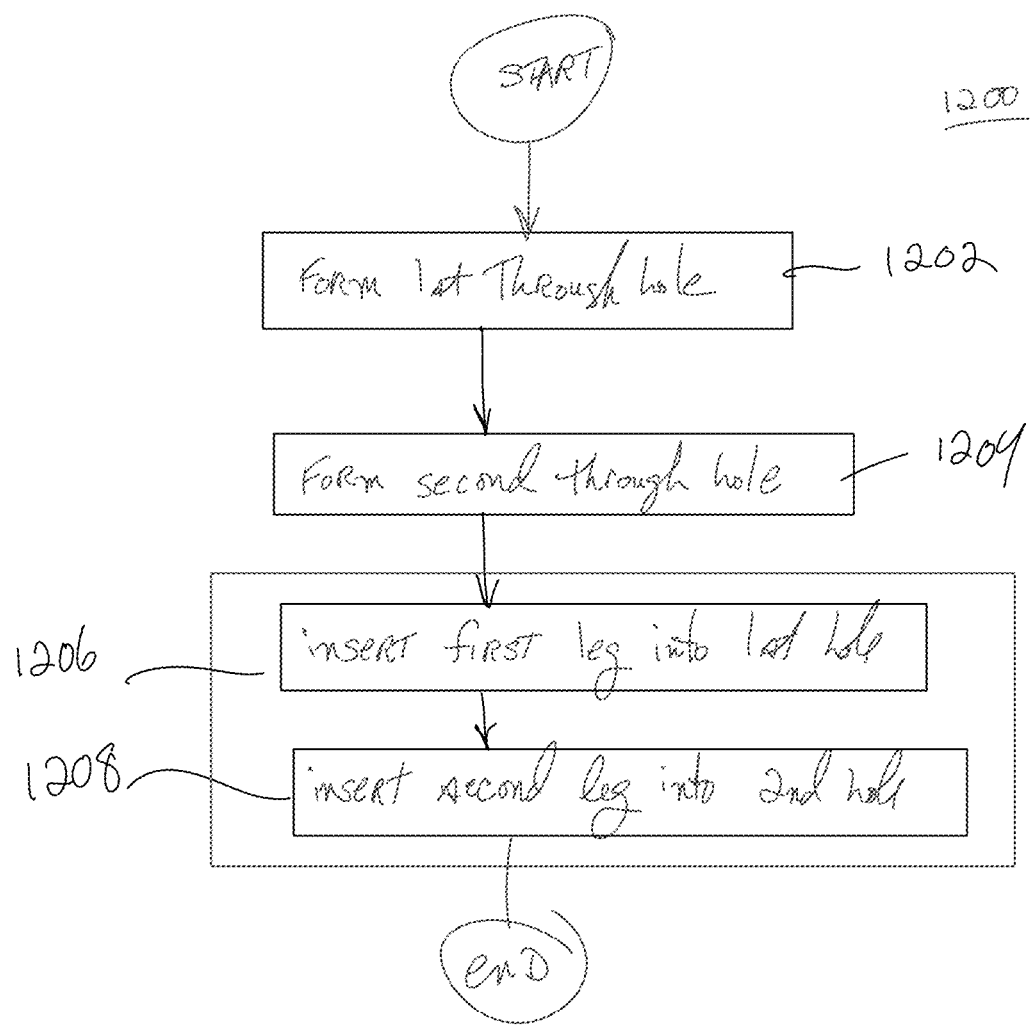

COMPLIANT STAPLE PIN FOR CONNECTING MULTIPLE PRINTED CIRCUIT BOARDS

CROSS-REFERENCE TO RELATED APPLICATIONS

Not applicable.

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not applicable.

STATEMENT REGARDING PRIOR DISCLOSURES BY THE INVENTOR OR A JOINT INVENTOR

Not applicable.

BACKGROUND OF THE INVENTION

Connecting the electronic devices on separate circuit boards is typically accomplished using one or more flexible wires, the opposite ends of which are provided with connectors that mate with connectors attached to the circuit boards themselves. An example of such an inter-circuit board connection is the ribbon cable commonly used to connect the different circuit boards found in many "desktop" personal computers. Such prior art connections have drawbacks, one of which is their cost. Another drawback is that they are susceptible to failure when they are assembled or when they are disassembled. They are also unable to mechanically couple circuit boards to each other but are instead limited to electrically connecting them. A method and apparatus for reliably and economically connecting circuit boards and the components on them both electrically and mechanically would be an improvement over the prior art.

BRIEF SUMMARY OF THE INVENTION

In accordance with embodiments of the invention, circuit boards are mechanically connected to each other by a U-shaped pin, the legs of which are forcibly inserted into holes along edges of the circuit boards. The holes are conventional through-holes having metal linings that are electrically connected to circuit board traces that extend to components on the circuit boards. The U-shaped pin thus electrically connects components on the two circuit boards to each other.

BRIEF DESCRIPTION OF THE SEVERAL VIEWS OF THE DRAWINGS

FIG. 12 depicts steps of a method of joining two circuit boards electrically and mechanically using U-shaped staples or pins.

DETAILED DESCRIPTION OF THE INVENTION

Figure 1:
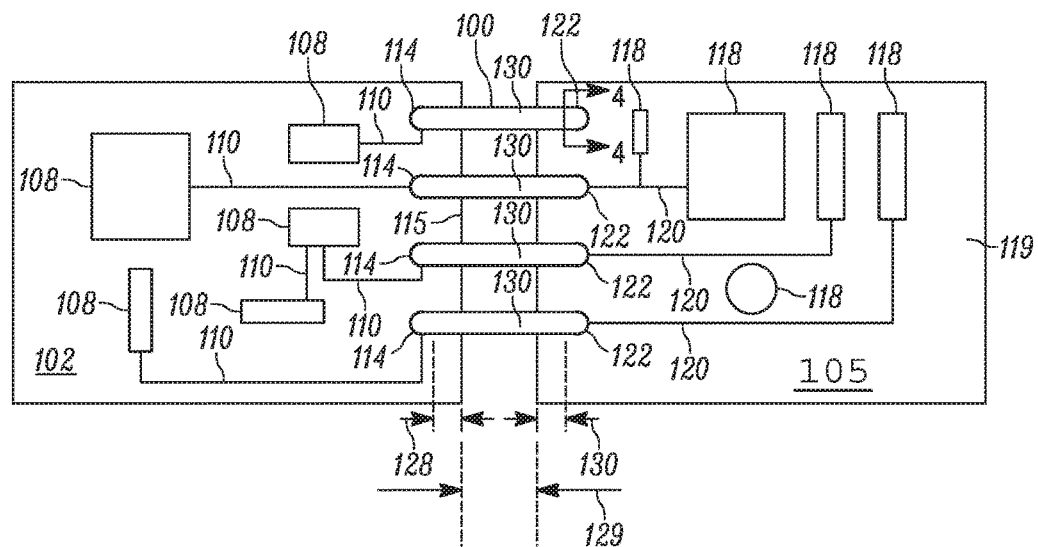
FIG. 1 is a top view of two circuit boards, each having electrical components on them, attached to each other by a compliant staple.
Figure 2:
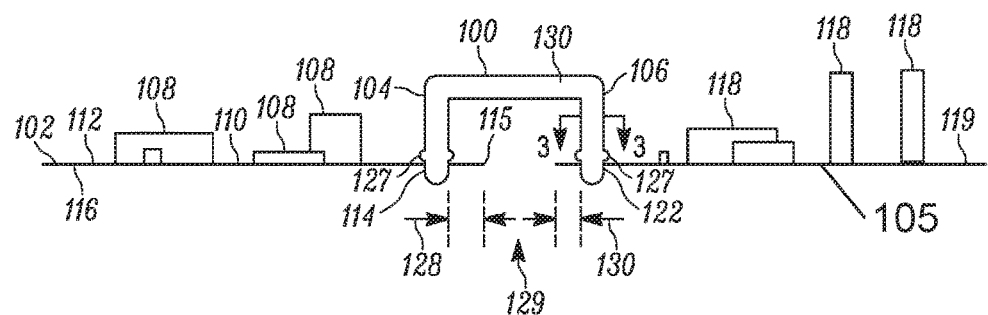
FIG. 2 is a side view of the circuit boards and substantially U-shaped connecting staple shown in FIG. 1.

FIG. 1 is a top view of a compliant staple 100, which mechanically couples two circuit boards 102, 105 to each other and which also provides an electrical pathway or coupling between electrical components mounted on the two circuit boards 102, 105. As best seen in FIG. 2, which is a side view of the staple 100 and circuit boards 102, 105 the staple 100 is essentially a substantially U-shaped metal pin, formed to have two legs 104 and 106 which are vertical and substantially parallel to each other. The first circuit board 102, which can be made of a prior art material, has several electronic components 108 attached to the top surface 112 of the circuit board 102 and which are connected to each other by thin conductive strips of metal 110, commonly referred to as circuit board "traces."

As best seen in FIG. 1, the circuit board traces 110 extend between the electronic components 108 but they also extend to conventional through holes 114 that formed through the circuit board 102. As best seen in FIG. 2, the through holes 114 extend completely through the circuit board 102, i.e., through its top surface 112 and its bottom surface 116.

The through-holes are conventional. They are typically formed by first drilling or machining small-diameter holes through the dielectric material from which the circuit board is made. The holes through the circuit board material are then coated with a layer of metal to form essentially a metal cylinder, the top and bottom ends of which can be electrically joined to one or more circuit board traces using conventional circuit board fabrication techniques.

As with the first circuit board 102, the second circuit board 105 has several electronic components 118 on its top surface 119. As with the components on the first circuit board 102, the electronic components 118 on the second circuit board 105 are also connected to each other by circuit board traces 120. The traces 120 on the second circuit board 105 also connect the electronic components 118 to through holes 122 formed through the second circuit board 105.

The through holes 114 in the first circuit board 102 are "set back" or located away from a side or lateral edge 115 of the circuit board 102 by a relatively small distance identified by reference numeral 128. Similarly, the through holes 122 in the second circuit board 105 are set back from a lateral edge 123 of the second circuit board 105 by a small distance 130.

As best seen in FIG. 2, the U-shaped pin 100 comprises two substantially vertical, substantially parallel and substantially-equal length vertical legs 104 and 106. In preferred embodiments, the legs 104, 106 of the U-shaped pin 100 are provided with a "shoulder" 127. The shoulder 127 is simply a localized enlargement of the cross-sectional size of the pin, i.e., it extends completely around a leg. The shoulder 127 provides a surface for a machine (not shown) to apply a downward insertion force to the pin 100, which is required to drive the pin into a hole. The shoulder 127 also limits how far the legs of a pin 100 can be pressed into a hole in a printed circuit board.

The legs 104, 106 are separated from each other by a distance equal to the sum of the setback distances 128 and 130 and the separation distance 129 between the edge 115 of the first circuit board 102 and the edge 123 of the second circuit board 105. The horizontal portion of the pin 100 that is between the legs 102, 104 is considered herein to "connect" the legs to each other. That horizontal portion is referred to herein as a leg connecting section 130.

In a preferred embodiment the staple 100 is formed from a thin metal sheet, which sheared to form thin strips. The strips are then stamped to provide the U-shaped pin depicted in the figures. Such a pin will have a cross section having a shape that is rectangular or square.

Figure 3A:
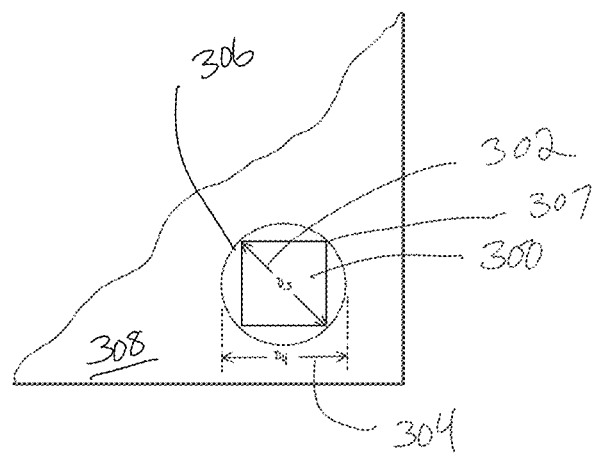
FIGS. 3A-3C are isolated top views of the staple in a through holes, as shown in FIG. 2, taken through section lines 3-3.

FIG. 3A is an isolated top view of a substantially U-shaped metal pin taken through section lines 3-3 as shown in FIG. 2. The pin 300 has a substantially square cross section the diagonal 302 of which has a length substantially equal to the inside diameter 304 of a hole 306 formed all the way through a circuit board 308. In a preferred embodiment the diagonal 302 and the diameter 304 are sized relative to each other such that an interference fit exists between the corners 307 of the pin 300 and the inside surface of the hole 306 when the pin 300 is inserted into the hole 306.

Figure 3B:
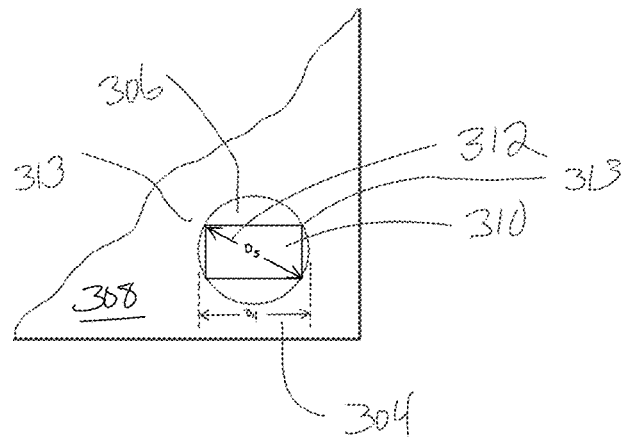

FIG. 3B shows an alternate embodiment of a pin 310, which is rectangular. The diagonal 312 of the pin 310 is substantially equal to the diameter 304 of the hole 306. The length of the diagonal 312 is selected such that an interference fit will exist between the inside diameter of the hole 306 and the corners 313 of the pin 310.

Figure 3C:
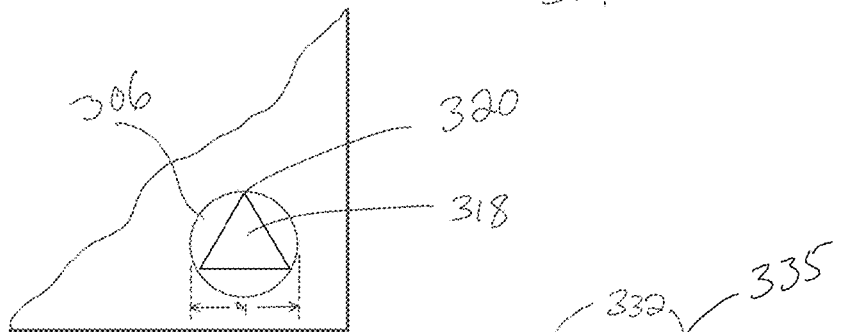

FIG. 3C shows yet another embodiment of a pin 318 having a triangular cross section. The pin 318 is sized to provide an interference fit between the corners 320 of the pin 318 and the inside surface of the hole 306.

Figure 3D:
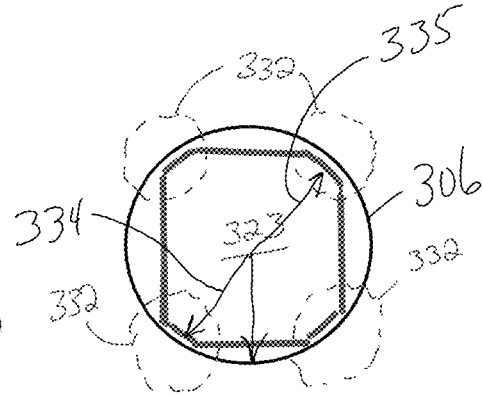
FIG. 3D is an isolated view of an alternate embodiment of the staple taken through section lines 3-3.

FIG. 3D is yet another embodiment of a pin 323 having corner regions or sections 332 which are rounded to have a radius of curvature 334 substantially equal to the radius of curvature of the hole 306. The diagonal distance or length 335 is nevertheless selected to provide an interference fit between the pin 330 and the hole 336.

Figure 4A:
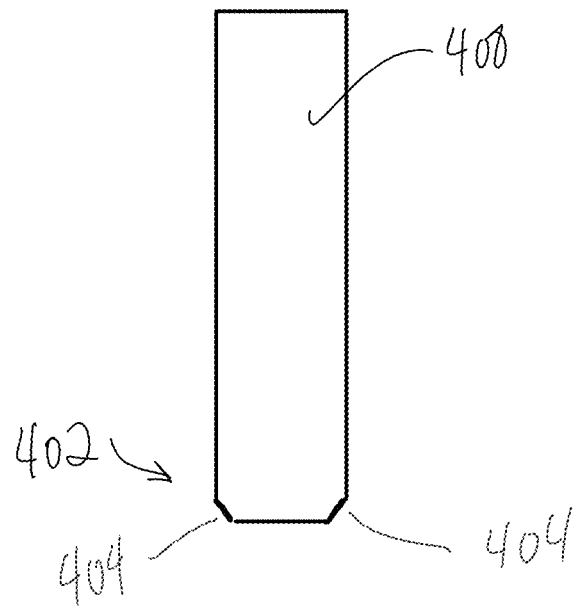
FIG. 4A is a side view of the staple taken through section lines 4-4 as shown in FIG. 1.

FIG. 4A is a cross sectional view of the leg 106 of the U-shaped pin 100 taken through sectional lines 4-4. (See FIG. 1.) The leg 126 in FIG. 4A is essentially rectangular. Its bottom end 402, however, is provided with chamfers or bevels 404, which extend completely around the leg 106. The chamfers 404 enable the leg 106 to "center" itself in a hole when the staple 100 is pressed toward and into holes in circuit boards. Legs with chamfers 404 are thus considered herein to be self-centering. In an alternate embodiment, sharp outside corners of a pin are rounded over or provided a "radius" along the entire length of a leg to provide a wider or broader electrical contact surface for the insider surface of a hole.

Figure 4B:
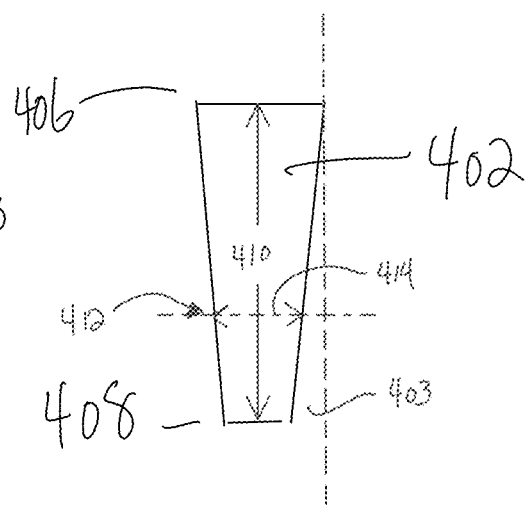
FIG. 4B is a side view of the staple through section lines 4-4 showing an alternate embodiment of the leg of the staple.

FIG. 4B shows an alternate embodiment of a leg 402 having a taper 403 around all four sides of the leg 402 (one side shown). The top 406 of the pin 402 is wider than the bottom 408.

The taper 403 and the length 410 of the pin 402 are selected such that at a predetermined location 412 along the length 410 of the pin 402, selected to provide an extension of the pin 402 below the bottom surface of a circuit board, the diameter 414 of the pin 402 at the predetermined location 412 will exceed the inside diameter of the hole into which the pin 402 is driven thus providing an interference fit for portions of the pin 402 above the predetermined location 412.

Figure 5:
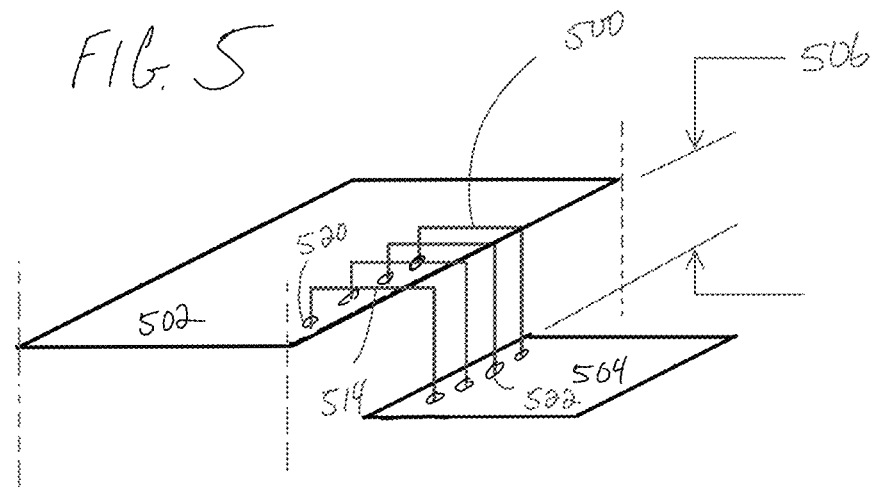
FIG. 5 is a perspective view of an alternate embodiment of two circuit boards electrically and mechanically connected to each other using compliant staples.
Figure 6:
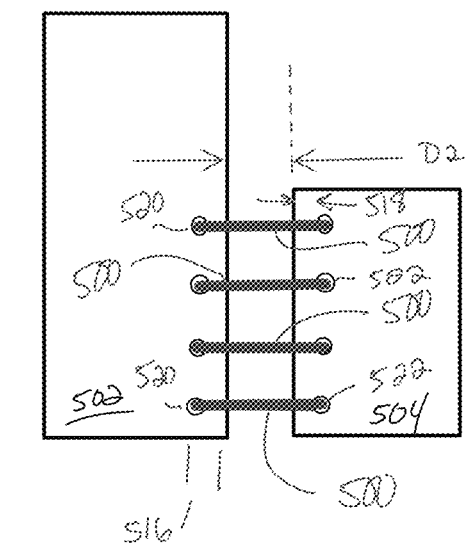
FIG. 6 is a top view of the circuit boards shown in FIG. 5.
Figure 7:
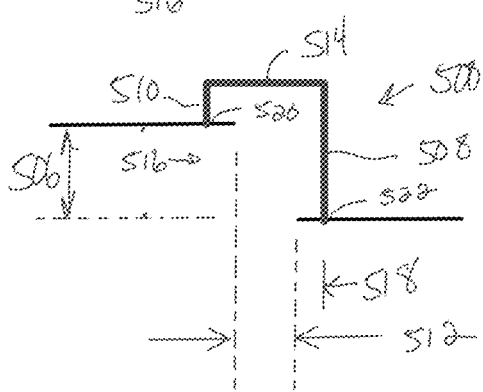
FIG. 7 is a side view of the circuit boards shown in FIGS. 5 and 6.

Referring now to FIGS. 5, 6 and 7 there is shown an alternate embodiment of a substantially U-shaped pin 500, configured to electrically and mechanically couple two circuit boards 502 and 504 to each other. The circuit boards 502, 504 support electrical components, which are omitted from FIGS. 5, 6 and 7 for clarity.

Unlike the circuit boards shown in FIGS. 1 and 2, the circuit boards 502, 504 shown in FIG. 5 are vertically offset from each other by a first vertical separation distance 506. The U-shaped pin, best seen in FIG. 7, has a first leg 508 that is longer than the second leg 510 by the vertical separation distance 506. The different leg lengths enable the pin 500 to electrically and mechanically couple the circuit boards 502 and 504, and electrical components on them to each other.

As best seen in FIG. 6, the two circuit boards 502, 504 are laterally separated from each other by a horizontal separation distance 512. The legs 508 and 510 are thus separated and connected to each other by a leg connecting section 514 the length of which is equal to the separation distance 512 plus the aforementioned hole offset distances 516 to 518 of the through holes 520 and 522 that extend through the two circuit boards 502 and 504.

FIG. 8, FIG. 9, FIG. 10 and FIG. 11 are side views of various embodiments of substantially U-shaped metal pins. Each leg of each pin is preferably provided with the aforementioned shoulder 127.

Figure 8:
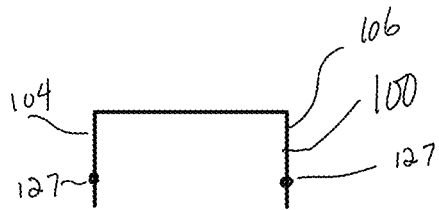
FIGS. 8-11 are side views of various embodiments of a compliant staple pin for use in connecting multiple PCs together.
Figure 9:
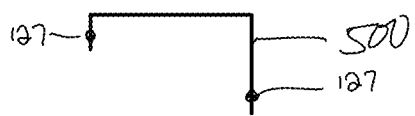
Figure 10:
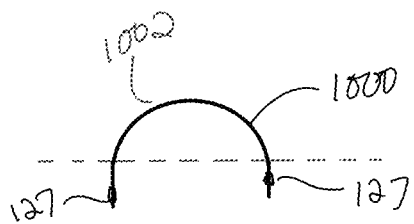
Figure 11:
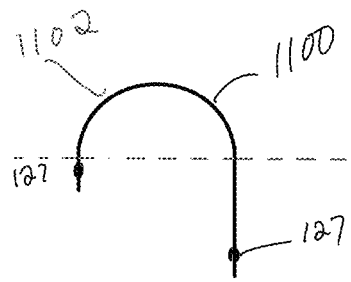

FIG. 8 shows the metal pin 100 depicted in FIGS. 1 and 2. FIG. 9 depicts the metal pin 500 shown in FIGS. 5-7. FIGS. 10 and 11, however, depict an alternate embodiment of pins 1000, 1100 where the leg connecting sections 1002 and 1102 respectively are curved rather than straight with sharp corners between the leg connection sections and legs. Those of ordinary skill in the art will recognize that the pins shown in FIGS. 10 and 11 will not suffer from localized stress concentrations at the corners where the aforementioned vertical legs meet orthogonal leg connecting sections.

Finally, FIG. 12 depicts steps of a method 1200 for electrically and mechanically coupling two circuit boards to each other using the aforementioned U-shaped pins. At a first step 1202, a through hole is formed through one of the circuit boards. In a second step 1204, a second through hole is formed through the adjacent circuit board. The holes of course are lined or coated with a thin layer of metal. Since the metal coats the inside surfaces of the holes, the metal coating forms metal cylinders, the inside diameters of which are selected with the dimensions of the legs to provide an interference fit. In two subsequent steps 1206 and 1208 which can be performed either simultaneously or sequentially, the first and second legs of a U-shaped pin are inserted into the first and second holes. As described above, the dimensions of the hole and the dimensions of the legs of the pin are selected such that an interference fit exists between the pin and hole.

The foregoing description is for purposes of illustration only. The true scope of the invention is set forth in the following claims.

What is claimed is:

1. A method of mechanically connecting first and second circuit boards to each other and which also electrically connects electrical components on the first circuit board to electrical components on the second circuit board, the method comprising:
   forming a first through hole adjacent to a first edge of the first circuit board, the first through hole comprising a first metal cylinder that is electrically connected to electrical components on the first circuit board;
   forming a second through hole adjacent to a second edge of the second circuit board, the first edge being adjacent, spaced apart from, and substantially parallel to the second edge, the second through hole comprising a second metal cylinder that is electrically connected to electrical components on the second circuit board;
   inserting a first leg of a substantially U-shaped metal pin into the first through hole, by applying a downward force to an upper surface of a first shoulder, which is a localized enlargement of a cross-sectional size of the first leg, the cross-sectional size of the first leg being oriented perpendicularly to a length of the first leg, such that the first leg electrically contacts the first metal cylinder; and
   inserting a second leg of the substantially U-shaped metal pin into the second through hole, by applying a downward force to an upper surface of a second shoulder, which is a localized enlargement of a cross-sectional size of the second leg, the cross-sectional size of the second leg being oriented perpendicularly to a length of the second leg, such that the second leg electrically contacts the second metal cylinder.

2. The method of claim 1, wherein the inserting steps additionally comprise inserting the first leg into the first hole and inserting the second leg into the second hole when the first and second circuit boards are not co-planar.

3. The method of claim 1, wherein the inserting steps additionally comprise inserting the first leg into the first hole and inserting the second leg into the second hole when the first and second circuit boards are laterally offset from each other.

4. The method of claim 1, wherein the inserting steps additionally comprise inserting first and second legs that have a substantially rectangular cross section into first and second holes that are substantially circular in cross section.

5. The method of claim 1, wherein the step of inserting the first leg of the substantially U-shaped metal pin into the first through hole additionally comprises the step of forming an interference fit between the first leg and the first through hole.

6. The method of claim 1, wherein the first and second metal cylinders have circular cross sections and wherein the first and second legs of the substantially U-shaped metal pin have rectangular cross sections.

7. The method of claim 1, wherein the first and second metal cylinders have circular cross sections and wherein the first and second legs of the substantially U-shaped metal pin have rectangular cross sections and are tapered.

8. The method of claim 1, wherein the inserting steps additionally comprise inserting the first leg into the first hole and inserting the second leg into the second hole when the first and second circuit boards are substantially co-planar.

9. The method of claim 8, wherein the step of inserting the second leg of the substantially U-shaped metal pin into the second through hole additionally comprises the step of forming an interference fit between the second leg and the second through hole.

10. An apparatus for mechanically coupling first and second circuit boards to each other and for electrically connecting components on the first circuit board to components on the second circuit board, the apparatus comprising:
   a first circuit board having a first lateral edge and a first through hole, which is adjacent to the first lateral edge and laterally separated from the first lateral edge by a first predetermined distance, the first through hole being lined by a first metal cylinder that is electrically connected to electrical components on the first circuit board;
   a second circuit board having a second lateral edge and a second through hole, which is adjacent to the second lateral edge and laterally separated from the second lateral edge by a second predetermined distance, the second through hole being lined by a second metal cylinder that is electrically connected to electrical components on the second circuit board, the second lateral edge being separated from the first lateral edge by a circuit board edge separation distance;
   a substantially U-shaped metal pin comprising first and second legs separated from each other by a leg connecting section having a length substantially equal to the sum of the first and second predetermined distances and the circuit board edge separation distance, the first leg being located in the first through hole, the second leg being located in the second through hole, the leg connecting section spanning the circuit board edge separation distance
   the first leg having a first length and a first shoulder that is an enlargement of a cross-sectional size of the first leg, the cross-sectional size being oriented perpendicular to the first length, the first shoulder having an upwardly-facing surface configured to receive a downward insertion force for pressing the first leg into the first through hole; and
   the second leg having a second length and a second shoulder that is an enlargement of a cross-sectional size of the second leg, the cross-sectional size being oriented perpendicular to the second length, the second shoulder having an upwardly-facing surface configured to receive a downward insertion force for pressing the second leg into the second through hole.

11. The apparatus of claim 10, wherein the first and second metal cylinders have corresponding first and second inside diameters, the inside diameters and dimensions of the first and second legs being elected to provide an interference fit between the metal cylinders and the first and second legs.

12. The apparatus of claim 10, wherein the first and second legs are substantially parallel to each other.

13. The apparatus of claim 10, wherein at least one of the first and second legs is tapered.

14. The apparatus of claim 10, wherein at least one of the first and second legs has a distal end, which is beveled.

15. The apparatus of claim 10, wherein the first and second legs have different lengths.

16. The apparatus of claim 10, wherein the first and second legs have a cross section that is substantially rectangular.

17. The apparatus of claim 10, wherein the first and second legs have a cross section with corner portions, which have a first radius of curvature.

18. The apparatus of claim 17, wherein the first metal cylinder has an inside diameter with a corresponding second radius of curvature, wherein the first radius of curvature is substantially equal to the second radius of curvature.

* * * * *